United States Patent
Iida et al.

(10) Patent No.: US 6,333,652 B1
(45) Date of Patent: Dec. 25, 2001

(54) DELAY CIRCUIT

(75) Inventors: Jun Iida; Yoshikazu Iinuma; Naoki Kurihara; Takashi Nemoto, all of Kyoto (JP)

(73) Assignee: Rohm Co. Ltd., Kyoto (JP)

( * ) Notice: Subject to any disclaimer, the term of this patent is extended or adjusted under 35 U.S.C. 154(b) by 0 days.

(21) Appl. No.: 09/577,013

(22) Filed: May 24, 2000

(30) Foreign Application Priority Data

May 27, 1999 (JP) .................................................. 11-148439

(51) Int. Cl.[7] ...................................................... H03L 7/00
(52) U.S. Cl. ............................................. 327/161; 327/284
(58) Field of Search .................................... 327/158, 149, 327/147, 156, 161, 270, 271, 272, 277, 278, 284

(56) References Cited

U.S. PATENT DOCUMENTS 4,494,021 * 1/1985 Bell et al. ............................. 327/262
5,619,541 * 4/1997 Van Brunt et al. .................. 375/360

FOREIGN PATENT DOCUMENTS 7-86888    3/1995  (JP) .

* cited by examiner

*Primary Examiner*—Timothy P. Callahan
*Assistant Examiner*—Cassandra Cox
(74) *Attorney, Agent, or Firm*—Mattingly, Stanger & Malur, P.C.

(57) ABSTRACT

A delay circuit having a delay element circuit composed of a plurality of series-connected first circuit elements being connected to a common power supply line and having a delay time varying correspondingly to a voltage of the common power supply line, the delay element circuit being adapted to receive an input signal and output an output signal obtained by delaying the input signal, and a PLL circuit including an oscillator circuit composed of a plurality of series-connected second circuit elements, which are equivalent to the first circuit elements, respectively, are connected to the common power supply line. The PLL circuit is adapted to oscillate the oscillator circuit at a predetermined frequency locked to a reference clock frequency by comparing a phase of the reference clock signal with a phase of an output frequency of the oscillator circuit and controlling the voltage of the power supply line according to a result of the comparison.

10 Claims, 3 Drawing Sheets

DELAY CIRCUIT

BACKGROUND OF THE INVENTION

1. Field of the Invention

The present invention relates to a delay circuit and, particularly, to a delay circuit having a delay time which is hardly influenced by variation of fabrication process thereof or a fabrication process of a semiconductor circuit internally including the delay circuit, hardly influenced by external condition such as environmental variation, etc., and can be set finely and precisely with respect to an input signal thereof.

2. Description of the Related Art

In the recent recordable/rewritable compact disk (CD-R/RW), the data write speed is increased at a double rate. In such CD-R/RW, it is usual that data, which is transferred from a host computer through an interface such as small computer system interface (SCSI) or ATPI is EFM-modulated and supplied to a laser controller. A laser light from a laser oscillator, which is regulated. for data write by the laser controller, is ON/OFF controlled by the EFM-modulated data to irradiate predetermined tracks of the compact disk (CD) to thereby write the data in the CD.

In such CD-R/RW or an optical disk such as recordable compact disk (CD-R), digital video disk random access memory (DVD-RAM), a circuit for precisely setting a delay time as short as several pico-seconds to several tens nano-seconds is required in writing data by means of a data write device.

Further, with increase of the clock speed of such as central processing unit (CPU), it has been required to precisely set a delay time as short as several pico-seconds to several tens nano-seconds in even a usual logic circuit.

In a prior art circuit for precisely setting a very short delay time, it has been usual, in order to absorb a variation of delay time of individual delay circuits or individual semiconductor circuits each including a delay circuit, which are fabricated through a fabrication process of the delay circuit or a fabrication process of the semiconductor circuit, that the delay time of each delay circuit or each semiconductor circuit including the delay circuit is set by an external voltage signal during the fabrication process since the delay time of the delay circuit is influenced by the fabrication process. Alternatively, as disclosed in Japanese Patent Application Laid-open No. H7-86888, a delay circuit is provided with a control terminal for controlling a delay time thereof and the delay time of the delay circuit is controlled by measuring a practical amount of delay of the delay circuit by a suitable measuring device and, on the basis of the measurement, applying a control signal to the control terminal of the delay circuit to set the delay time thereof appropriately. Alternatively, a delay time of each delay circuit is corrected by measuring an amount of delay thereof by forming a micro cell including an analog to digital (A/D) converter, a digital to analog (D/A) and a CPU, etc., and regulating the delay time by a processor on the basis of the measured delay time.

In any of the prior arts, in order to precisely set a very short delay time of a delay circuit with respect to an input signal, it is necessary to regulate or correct the delay time of the delay circuit by measuring a practical delay time thereof. However, since, in the delay time correction using the regulation of the external voltage, the delay circuit is easily influenced by change of external environment such as temperature change, secular change and power source voltage change, etc., there is a problem on accuracy of delay time.

SUMMARY OF THE INVENTION

An object of the present invention is to provide a delay circuit having a delay time, which is hardly influenced by the fabrication process of a delay circuit or a semiconductor device including the delay circuit, is hardly influenced by external condition such as environmental change and can be set precisely with respect to an input signal.

In order to achieve the above object, a delay circuit according to the present invention is featured by comprising a delay element circuit composed of a series circuit of a plurality of first circuit elements, which are connected to a common power supply line and have a delay time varying correspondingly to a voltage of the common power supply line, for receiving the input signal and outputting an output signal obtained by delaying the input signal, and a phase-locked loop (PLL) circuit including an oscillator circuit composed of a series circuit of a plurality of second circuit elements, which are equivalent to the first circuit elements, respectively, and connected to the common power supply line, for oscillating the oscillator circuit at a predetermined frequency locked to a reference clock signal frequency by comparing a phase of the reference clock signal with a phase of an output frequency of the oscillator circuit and controlling the voltage of the power supply line according to a result of the comparison.

Thus, according to the present invention, the delay element circuit is formed by the first circuit elements equivalent to the respective second circuit elements of the PLL circuit and the oscillation frequency of the PLL circuit is locked to the reference clock signal frequency. Therefore, it is possible to control the delay time of the second circuit elements of the delay element circuit measured from the signal input time thereto to the signal output time to a constant value, which is determined by the reference clock signal frequency, to thereby set the delay time of the first circuit elements.

It is usual that a clock generator circuit for generating the reference clock signal frequency, which is substantially constant and is hardy influenced by external condition such as temperature change, secular change and/or power source voltage, etc., is formed internally of an integrated circuit (IC). Therefore, by utilizing such construction of a delay circuit as that of the delay circuit of the present invention, a delay circuit can be realized as a stable circuit which is hardly influenced by external condition and is free from variation in delay time.

Particularly, when a crystal oscillator, etc., is utilized as the clock generator circuit for generating the reference clock, it is possible to realize a delay circuit which does not require a delay time regulation.

BRIEF DESCRIPTION OF THE DRAWINGS

The above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

Figure 1:
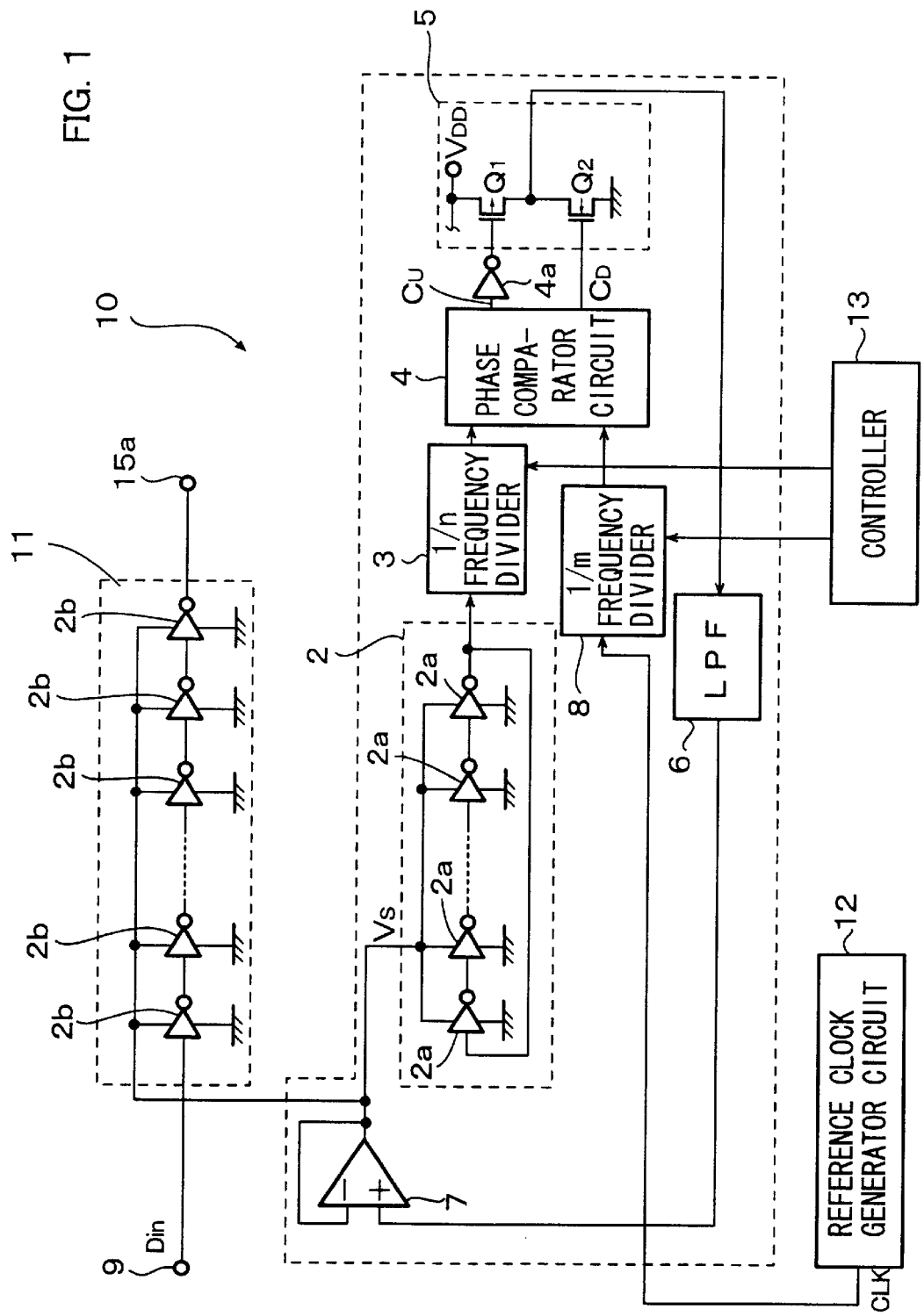
FIG. 1 is a circuit diagram of a delay circuit according to an embodiment of the present invention.

In FIG. 1, a delay circuit 10 according to the present invention comprises a PLL circuit 1, a delay element circuit 11 composed of a plurality of series-connected inverters 2b, a reference clock generator circuit 12 and a controller 13. In this embodiment, the reference clock generator circuit 12 is constructed with a crystal oscillator, etc., and an oscillation frequency thereof is hardly influenced by variation of external condition.

The PLL circuit 1 as a whole constitutes an oscillator circuit, which oscillates at a frequency (or phase) locked to a frequency (or phase) of a reference clock signal CLK from the reference clock generator circuit 12, and outputs a power source voltage signal for setting a delay time of each inverter element of the delay element circuit 11. The PLL circuit 1 comprises a voltage-controlled oscillator (VCO) 2 composed of a series-connected circuit of an odd number of inverters 2a, a 1/n frequency divider 3, where n is an integer, a phase comparator circuit 4, a charge pump 5, a low-pass filter (LPF) 6, a voltage follower 7 and a 1/m frequency divider 8, where m is an integer. The voltage signal applied to the respective inverters 2b of the delay element circuit 11 as a control voltage Vs is also applied to the respective inverters 2a of the VCO 2.

In this embodiment, the VCO 2 takes in the form of a ring oscillator formed by feeding back an output of the series-connected inverter circuit thereof to an input thereof. The series-connected inverters 2b of the delay element circuit 11 are integrated together with the inverters 2a of the VCO 2 in an IC. Thus, the inverters 2a of the VCO 2 are provided as a circuit substantially equivalent to the inverters 2b of the delay element circuit 11. Since the inverters 2a and the inverters 2b are supplied with the control voltage Vs and the operation delay times of each of the inverters 2a and each of the inverters 2b are changed correspondingly to the value of the control voltage Vs, the operation delay time of the inverter 2a becomes equal to that of the inverter 2b.

The control voltage Vs as the common power source voltage of the inverters 2a and 2b controls the oscillation frequency of the VCO 2 of the PLL circuit 1 such that the oscillation frequency coincides with the frequency of the clock signal CLK of the reference clock generator circuit 12 or the frequency of the clock signal CLK multiplied by a predetermined coefficient value. That is, in the PLL circuit 12, the output frequency of the VCO 2 is divided by n by the 1/n frequency divider 3 and supplied to one input of the phase comparator circuit 4, in which it is compared in phase with the reference clock CLK divided by m by the 1/m frequency divider 8 and supplied to the other input of the phase comparator circuit 4.

The phase comparator circuit 4 sends a charge up signal CU, which is in "H" level for a time period corresponding to a phase difference between a rising of the clock signal CLK and a rising of the input signal to the VCO 2, to a gate of a P channel MOS transistor Q1 of the charge pump 5 on the current discharge side thereof through an inverter 4a to turn the P channel MOS transistor Q1 ON. In this case, a charge down signal CD from the phase comparator 4 becomes "L", to turn an N channel MOS transistor Q2 on the current sink side of the charge pump 5 OFF.

Further, the phase comparator circuit 4 sends the charge down signal CD, which is in "H" level for a time period corresponding to a phase difference between a rising of the input signal on the VCO 2 and a rising of the clock signal CLK, to a gate of the N channel MOS transistor Q2 of the charge pump 5 on the current sink side thereof to turn the N channel MOS transistor Q2 ON. In this case, the charge up signal CU becomes "L" to turn the P channel MOS transistor Q1 OFF.

The output signal of the charge pump 5 is supplied to the LPF 6 and, after it is smoothed thereby, inputted to the voltage follower 7. Thus, the control voltage Vs for controlling the oscillation frequency of the VCO 2 of the PLL circuit 1 such that the oscillation frequency coincides with the frequency of the clock signal CLK of the reference clock generator circuit 12 or a predetermined ratio of the frequency of the clock signal CLK is generated by the voltage follower 7.

As described, in the PLL circuit 1, the VCO 2 is driven by the output of the voltage follower 7 as the control voltage Vs for determining the operating voltage of the inverters. Thus, the oscillation frequency (or phase) of the VCO 2 is controlled so that the oscillation frequency is locked to the frequency of the clock signal CLK.

As a result, the oscillation frequency of the PLL circuit 1 is controlled such that it is locked to a value calculated by using, as a coefficient, the predetermined ratio determined by the frequency dividing ratios 1/n and 1/m of the frequency dividers 3 and 8 to the frequency of the reference clock generator circuit 12, which is hardly influenced by the external condition such as variation of temperature and/or power source voltage of the device, etc. In this case, the delay time of operation of each of the inverters 2a of the VCO 2 is determined correspondingly to the clock frequency of the reference clock generator circuit 12 and the control voltage Vs is constant. This is also applied to each of the inverters 2b of the delay element circuit 11, which operates under the same control voltage Vs, since the inverters 2b of the delay element circuit 11 are integrated in the IC together with the inverters 2a.

The delay time of the delay element circuit 11 is determined without substantial influence of the external condition such as variation of temperature and power source voltage of the device, etc. Assuming that the number of the series-connected inverters 2b is P and a delay time of each inverter 2b is τ, the delay time of the delay element circuit 11 with respect to the input signal Din of the input terminal 9 is determined by τ×P. A delay signal having a finely determined delay amount is outputted from the output terminal 15a of the delay element circuit 11, which is connected to the output of the last stage inverter 2b.

Particularly, since the frequency of the clock signal CLK generated by the reference clock generator circuit 12, which is constructed with a crystal oscillator, etc., is hardly influenced by fabrication process variation of each delay circuit or each semiconductor circuit including a delay circuit, the variation of delay time between the delay circuits can be substantially absorbed.

Incidentally, in this embodiment, the delay time τ each inverter is programmable. The delay time can be changed by changing the frequency dividing ratio n of the 1/n frequency divider 3 and the frequency dividing ratio m of the 1/m frequency divider 8 by the controller 13. The 1/n frequency divider 3 and the 1/m frequency divider 8 are constructed with a n-adic counter and an m-adic counter, respectively, such that the maximum count values n and m thereof can be changed by data setting from the controller 13.

Figure 2:
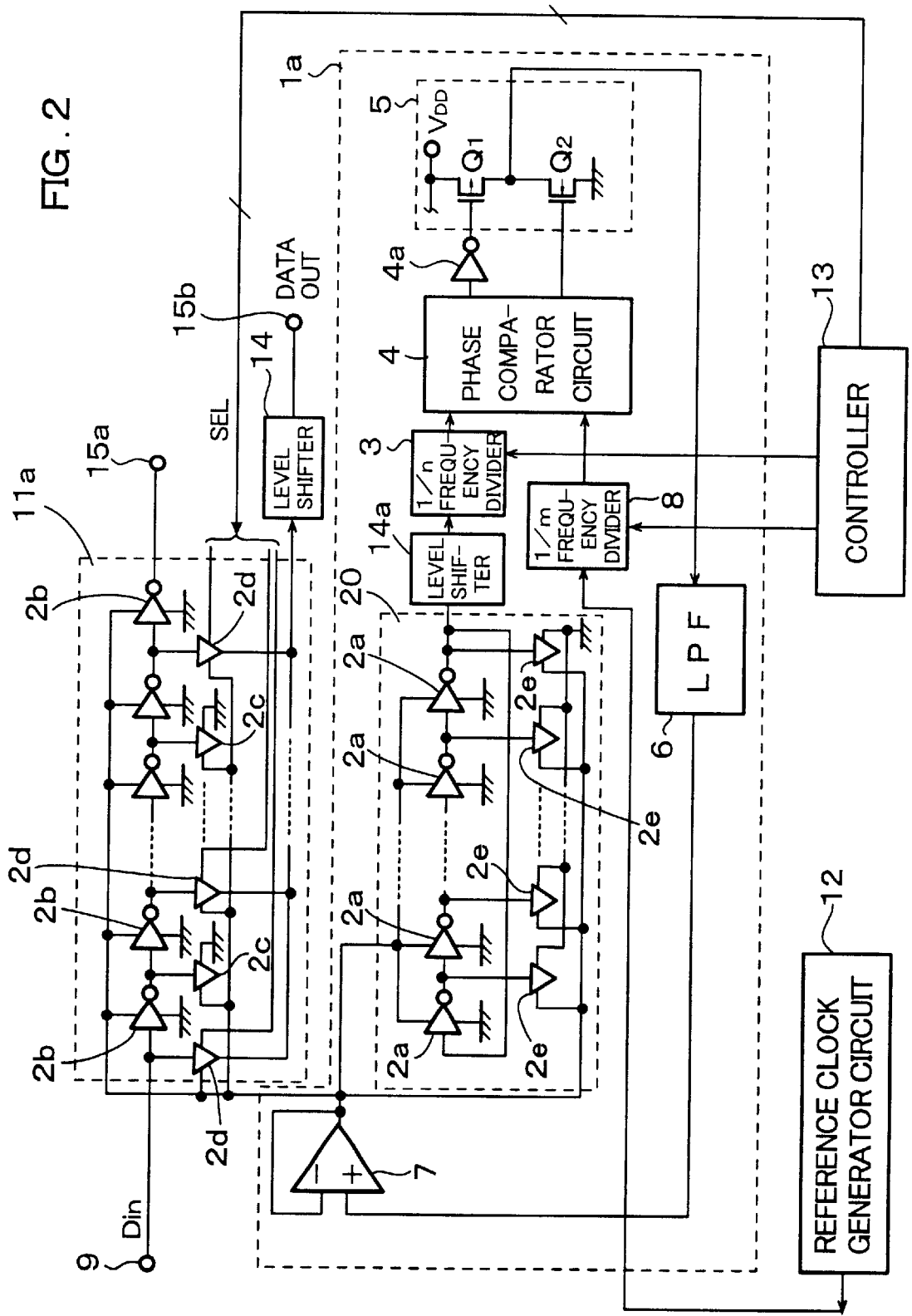
FIG. 2 is a circuit diagram of a delay circuit according to another embodiment of the present invention.

FIG. 2 is a circuit diagram of the delay circuit according to another embodiment of the present invention, which comprises a PLL circuit 1a and a delay element circuit 11a. The delay element circuit 11a comprises, in addition to series-connected inverters 2b similar to those of the delay element circuit 11 shown in FIG. 1, a plurality of 3-state buffer amplifiers 2c connected to outputs of the inverters 2b in the odd numbered stages as loads thereof, respectively, and a plurality of 3-state buffer amplifiers 2d connected to an input of the initial stage inverter 2b and to outputs of the inverters 2b of the even numbered stages, respectively, so that the delayed input signals can be derived from the inverters 2b of the even numbered stages through the buffers 2d connected thereto, respectively. The 3-state buffer amplifiers 2c and 2d alternately connected to the outputs of the inverters 2b as the loads thereof operate with a control voltage Vs from a voltage follower 7 as the power source, as in the first embodiment shown in FIG. 1. The 3-state buffer amplifiers 2c function as dummy loads of the respective inverters 2b to obtain equal delay times in the respective stages. The 3-state buffer amplifiers 2d functioning as the outputs of the respective inverters of the even numbered stages are grounded by a selection signal SEL from the controller 13 and supply output signals in a predetermined level H or L to a level shifter 14. The level shifter 14 receives the output signals from the inverters 2d in the even numbered stages, matches output levels "H" and "L" of the data thereof and sends them to an output terminal 15b.

The output of the inverter 2b in the last stage is sent to an output terminal 15a as in the first embodiment shown in FIG. 1.

In a PLL circuit 1a shown in FIG. 2, a VCO 20 is provided correspondingly to the described construction of the delay element circuit 11a. The VCO 20 is a ring oscillator, which includes, in addition to the inverters 2a of the VCO 2 shown in FIG. 1, 3-state buffer amplifiers 2e, which are dummy circuits connected to outputs of the respective inverters 2a as loads thereof. The 3-state buffer amplifiers 2e connected to the outputs of the respective inverters 2a are dummy load circuits corresponding to the 3-state buffer amplifiers 2c and 2d, which operate with the control voltage Vs and have GND terminals grounded.

An output of the VCO 20 is supplied to a 1/n frequency divider 3 through a level shifter 14a equivalent to the level shifter 14. Thus, the inverters 2a of the VCO 20 are provided as a circuit substantially equivalent to the inverters 2b of the delay element circuit 11a. As a result, the delay times of the inverters 2b of the delay element circuit 11a become substantially equal to those of the inverters 2a of the VCO 20.

Since other portions of the delay circuit shown in FIG. 2 than those mentioned above are the same as those of the delay circuit shown in FIG. 1 and depicted by the same reference numerals, respectively, details thereof are omitted for avoidance of duplication.

Figure 3:
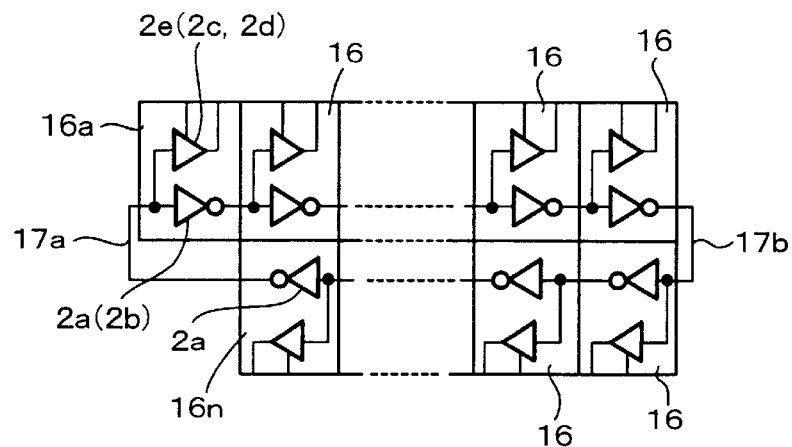
FIG. 3a shows a layout of a delay element portion and a voltage-controlled oscillator (VCO)
FIG. 3b shows a cell layout of a VCO and delay element circuit.
FIG. 3c shows a wiring line of the VCO and the delay element circuit.
Figure 3:
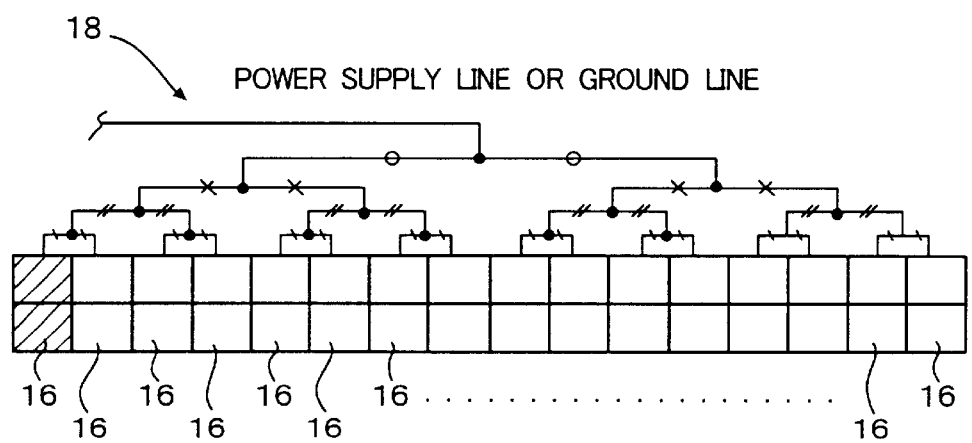
Figure 3:
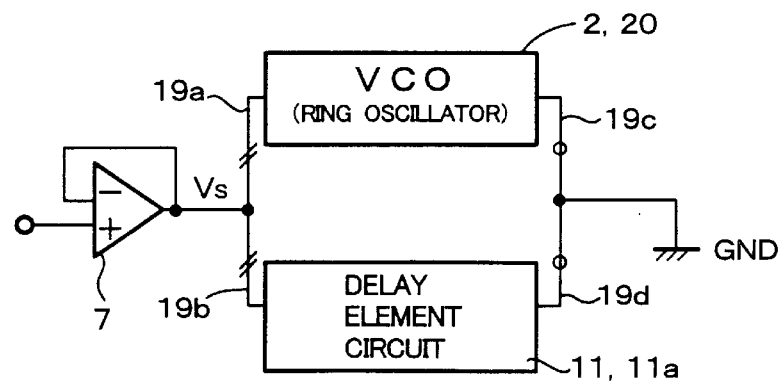

FIG. 3a shows a practical layout of the inverters 2a and 2e of the VCO 20 as well as the inverters 2b, 2c and 2d of the delay element circuit 11a, in which one of the inverters 2a (or 2b) and one of the 3-state buffer amplifiers 2e (or 2c and 2d) are paired as a cell 16i (i is a to n) and the cells 16b to 16n are formed as a 2-stage arrangement. In the VCO 20, the output of the inverter 2a of the cell 16n of the last stage is fed back to the input of the inverter 2a of the cell 16a of the initial stage through a wiring 17a and the output of the inverter 2a of the cell of the upper last stage is connected to the input of the inverter 2a of the cell immediately below the upper last stage through a wiring 17b, resulting in the ring oscillator circuit.

Lengths of the wiring 17a and the wiring 17b are selected as close to the length of the connection wiring between adjacent inverters 2a or between adjacent inverters 2b as possible.

The delay element circuit 11a is the same as that of the VCO 20 expect that the wiring 17a is removed.

By employing the described layouts of the VCO 20 and the delay element circuit 11a, it is possible to minimize an error of the delay time of each stage, which is set by the input signal.

As to the wiring of the power source line or the ground line GND, it is preferable that the lengths of the wiring between the power source line or the ground line and all of the cells 16 are made equal by using a tournament path wiring 18 shown in FIG. 3b, in which lengths of paired symmetrical wiring depicted by a symbol ⊙, X, // or \ are substantially the same. Such tournament path wiring 18 may be employed in deriving the outputs of the 3-stage buffer amplifiers 2d of the respective stages. In such case, it becomes possible to minimize the error of the delay time of each stage, which is set by the input signal.

FIG. 3c shows a wiring layout of the power source line for supplying the control voltage Vs of the voltage follower 7 to the delay element circuit 11 or 11a and the VCO 2 or 20. In the shown layout, the control voltage Vs is supplied to the VCO 2 or 20 and the delay element circuit 11 or 11a through wiring 19a and 19b, which have substantially the same lengths, and the VCO 2 or 20 and the delay element circuit 11 or 11a are grounded through wiring 19c and 19d, which have substantially the same lengths.

Although the inverters are used as the delay elements in the described embodiments, other elements may be used as the delay elements, alternatively. For example, any circuit element such as a flip-flop circuit, which operates with a predetermined delay with respect to an input signal., may be used therefor.

What is claimed is:

1. A delay circuit comprising:
a delay element circuit composed of a plurality of series-connected first circuit elements each being connected to a common power supply line and having a delay time varying correspondingly to a voltage of said common power supply line, said delay element circuit being adapted to receive an input signal and output an output signal obtained by delaying the input signal; and
a phase-locked loop circuit including an oscillator circuit composed of a plurality of series-connected second circuit elements equivalent to said first circuit elements, respectively, and a voltage follower having an input terminal supplied with a voltage signal and an output terminal connected to said common power supply line, said second circuit elements being connected to said common power supply line, said phase-locked loop circuit being adapted to oscillate said oscillator circuit at a predetermined frequency locked to a reference clock frequency by comparing a phase of the reference clock with a phase of an output frequency of said oscillator circuit and controlling the voltage of said common power supply line according to said voltage signal which is generated corresponding to a result of the comparison.

2. A delay circuit as claimed in claim 1, wherein said first and second circuit elements are inverters integrated together with said oscillator circuit in an IC.

3. A delay circuit as claimed in claim 2, wherein said first and second circuit elements are inverters, respectively, said oscillator circuit is a ring oscillator formed by feeding an output thereof back to an input thereof, said phase-locked loop circuit includes at least one frequency divider for dividing a frequency of either one of an output signal of said ring oscillator and said reference clock signal and a phase comparator for comparing a phase of the frequency of a signal, which is divided by said frequency divider, with the other of the output signal of said ring oscillator and the reference clock signal.

4. A delay circuit as claimed in claim 3, further comprising a crystal oscillator for generating the reference clock signal, wherein said voltage signal is generated corresponding to an output of said phase comparator.

5. A delay circuit as claimed in claim 4, wherein said phase-locked loop circuit further comprises a charge pump circuit supplied with the output of said phase comparator circuit and a low-pass filter supplied with an output of said charge pump circuit, wherein the voltage signal inputted to said voltage follower is outputted from said low-pass filter.

6. A delay circuit as claimed in claim 5, wherein said frequency divider comprises a first frequency divider circuit for dividing the frequency of the output signal of said ring oscillator and a second frequency divider circuit for dividing the frequency of the reference clock signal, a frequency dividing ratios of said first and second frequency divider circuits being set externally.

7. A delay circuit as claimed in claim 3, wherein a buffer amplifier is connected to an output of each of said inverters as a load and said buffer amplifiers are supplied with power from said power supply line.

8. A delay circuit as claimed in claim 7, wherein the output corresponding to the input signal delayed is derived from said buffer amplifiers connected to said inverters in even numbered stages of said delay element circuit.

9. A delay circuit as claimed in claim 8, wherein the outputs of said buffer amplifiers in the even numbered stages of said delay element circuit are outputted through a level shifter circuit and one of said buffer amplifiers in said even numbered stages is selected to operate by an external selection signal.

10. A delay circuit as claimed in claim 9, wherein an output of said delay element circuit, which is delayed with respect to the input signal, is derived from said inverter in the last one of said stages.

* * * * *